United States Patent
Imai et al.

(10) Patent No.: US 11,495,488 B2
(45) Date of Patent: Nov. 8, 2022

(54) METHOD FOR MANUFACTURING BONDED SOI WAFER AND BONDED SOI WAFER

(71) Applicant: SHIN-ETSU HANDOTAI CO., LTD., Tokyo (JP)

(72) Inventors: Toshikazu Imai, Chikuma (JP); Kazuhiko Yoshida, Chikuma (JP); Miho Niitani, Nagano (JP); Taishi Wakabayashi, Nagano (JP); Osamu Ishikawa, Annaka (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 16/973,575

(22) PCT Filed: May 14, 2019

(86) PCT No.: PCT/JP2019/019017
§ 371 (c)(1),
(2) Date: Dec. 9, 2020

(87) PCT Pub. No.: WO2019/239763
PCT Pub. Date: Dec. 19, 2019

(65) Prior Publication Data
US 2021/0249301 A1 Aug. 12, 2021

(30) Foreign Application Priority Data
Jun. 14, 2018 (JP) .............................. JP2018-114001

(51) Int. Cl.
*H01L 21/762* (2006.01)
*H01L 21/265* (2006.01)

(52) U.S. Cl.
CPC .. *H01L 21/76254* (2013.01); *H01L 21/26506* (2013.01)

(58) Field of Classification Search
CPC ............... H01L 21/76254; H01L 21/26506
See application file for complete search history.

(56) References Cited

U.S. PATENT DOCUMENTS 5,229,305 A * 7/1993 Baker ................. H01L 21/3221
148/DIG. 12
2010/0200927 A1 8/2010 Greco et al.
(Continued)

FOREIGN PATENT DOCUMENTS

JP H02-46756 A 2/1990
JP H08-186167 A 7/1996
(Continued)

OTHER PUBLICATIONS

Jul. 2, 2019 International Search Report issued in International Patent Application No. PCT/JP2019/019017.
(Continued)

*Primary Examiner* — Dale E Page
*Assistant Examiner* — Quovaunda Jefferson
(74) *Attorney, Agent, or Firm* — Oliff PLC

(57) ABSTRACT

A method for manufacturing a bonded SOI wafer, the method using a silicon single crystal wafer having a resistivity of 100 Ω·cm or more as the base wafer, and including steps of: forming an underlying insulator film on a bonding surface side of the base wafer; depositing a polycrystalline silicon layer on a surface of the underlying insulator film; polishing a surface of the polycrystalline silicon layer; modifying the polycrystalline silicon layer by performing ion implantation on the polished polycrystalline silicon layer to form a modified silicon layer; forming the insulator film on a bonding surface of the bond wafer; bonding the bond wafer and a surface of the modified silicon layer of the base wafer with the insulator film interposed therebetween; and thinning the bonded bond wafer to form an SOI layer. This (Continued)

provides a bonded SOI wafer excellent in harmonic wave characteristics.

6 Claims, 3 Drawing Sheets

(56) References Cited

U.S. PATENT DOCUMENTS

| | | | |
|---|---|---|---|
| 2013/0214275 A1* | 8/2013 | Adkisson | H01L 29/66242 257/51 |
| 2017/0033002 A1 | 2/2017 | Meguro et al. | |
| 2017/0040210 A1* | 2/2017 | Wakabayashi | H01L 21/02428 |
| 2017/0103913 A1 | 4/2017 | Dutartre et al. | |
| 2017/0338143 A1 | 11/2017 | Peidous et al. | |
| 2018/0233400 A1 | 8/2018 | Wang et al. | |

FOREIGN PATENT DOCUMENTS

| | | |
|---|---|---|
| JP | 2012-517691 A | 8/2012 |
| JP | 2015-211061 A | 11/2015 |
| JP | 2015-211074 A | 11/2015 |
| JP | 2015-220321 A | 12/2015 |
| JP | 2015-228432 A | 12/2015 |
| JP | 2016-143820 A | 8/2016 |
| JP | 2017-510080 A | 4/2017 |
| JP | 2017-538297 A | 12/2017 |
| JP | 2018-507562 A | 3/2018 |

OTHER PUBLICATIONS

Dec. 15, 2020 International Preliminary Report on Patentability issued in International Patent Application No. PCT/JP2019/019017.

* cited by examiner

[FIG. 1]
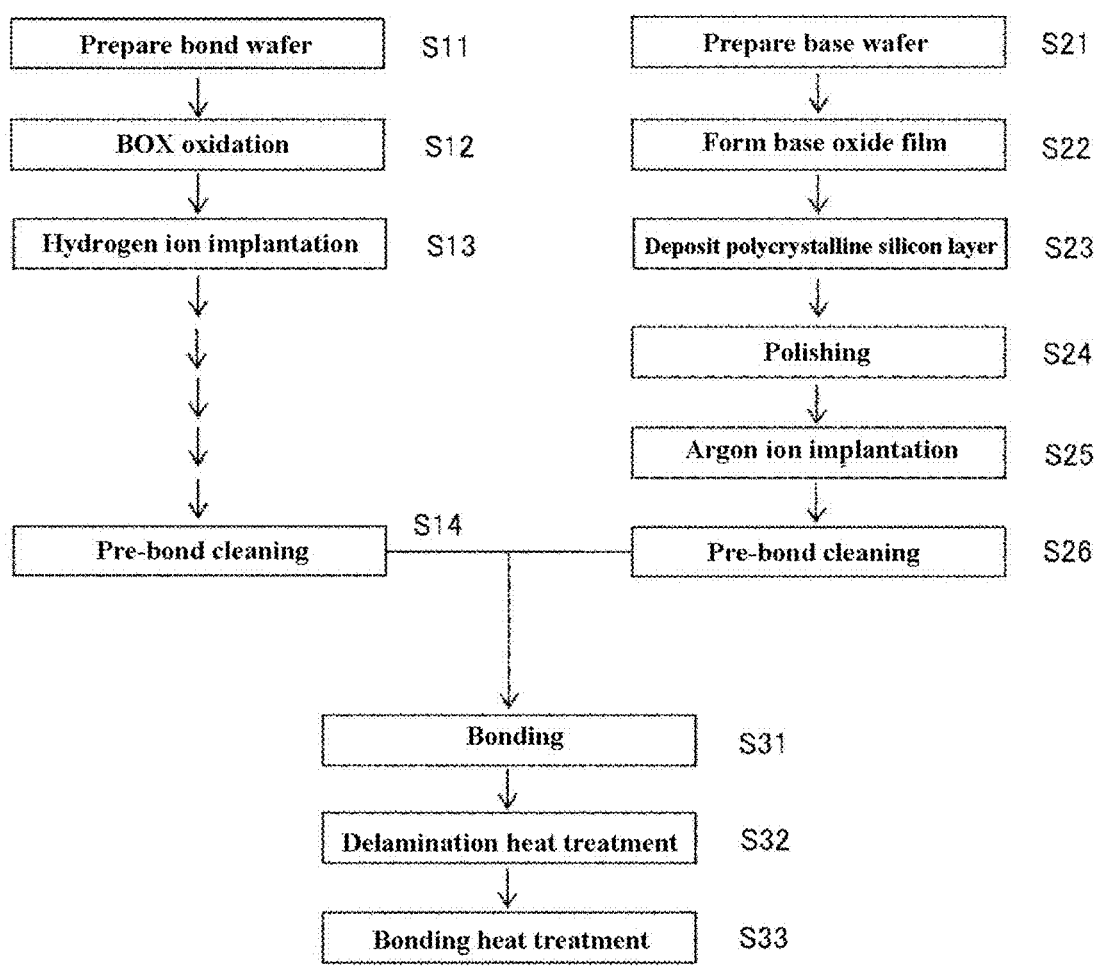

[FIG. 2]
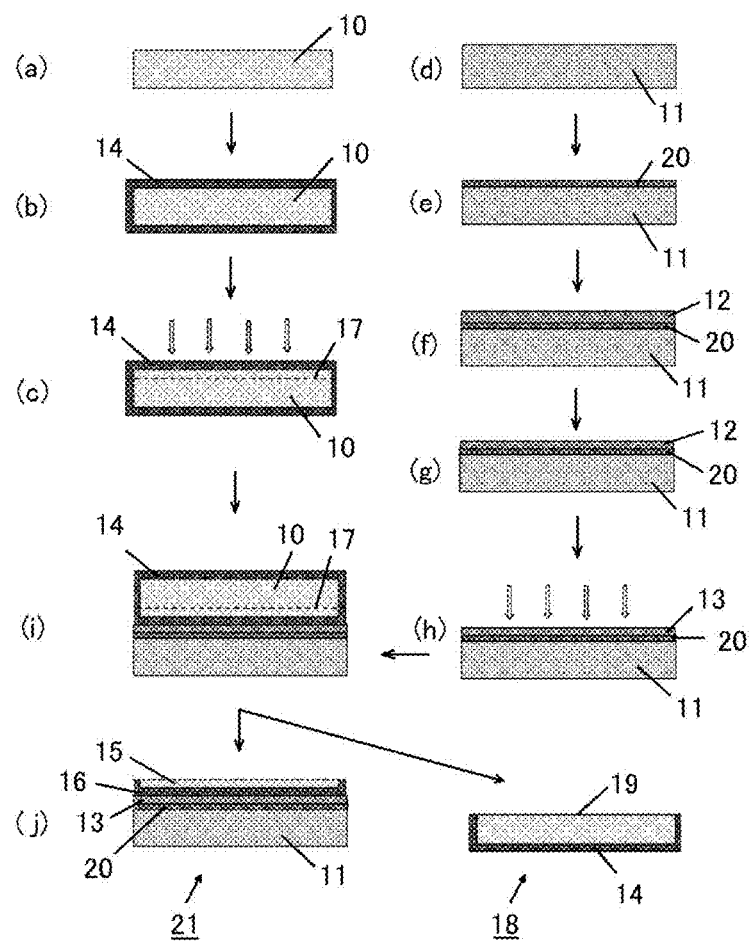
[FIG. 3]
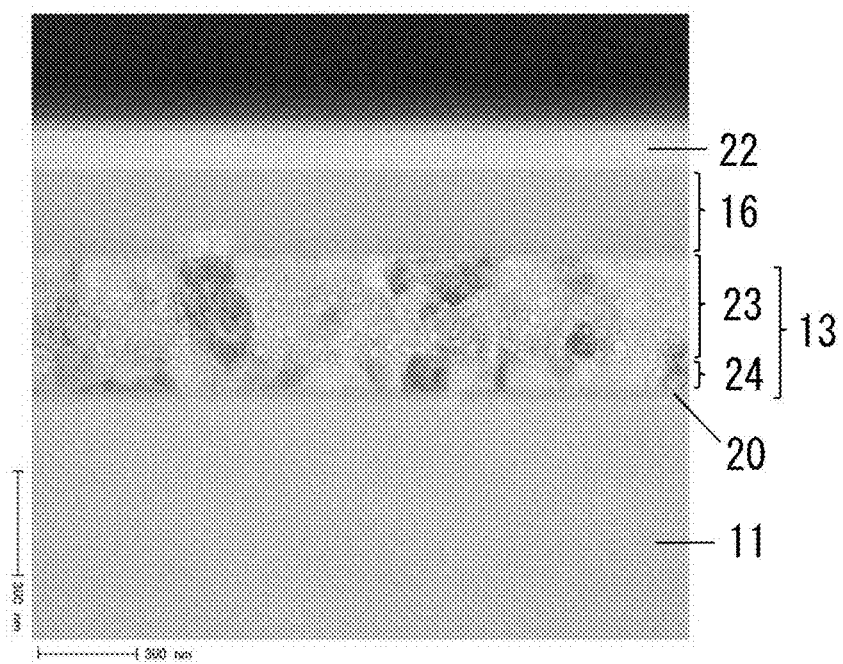

[FIG. 4]
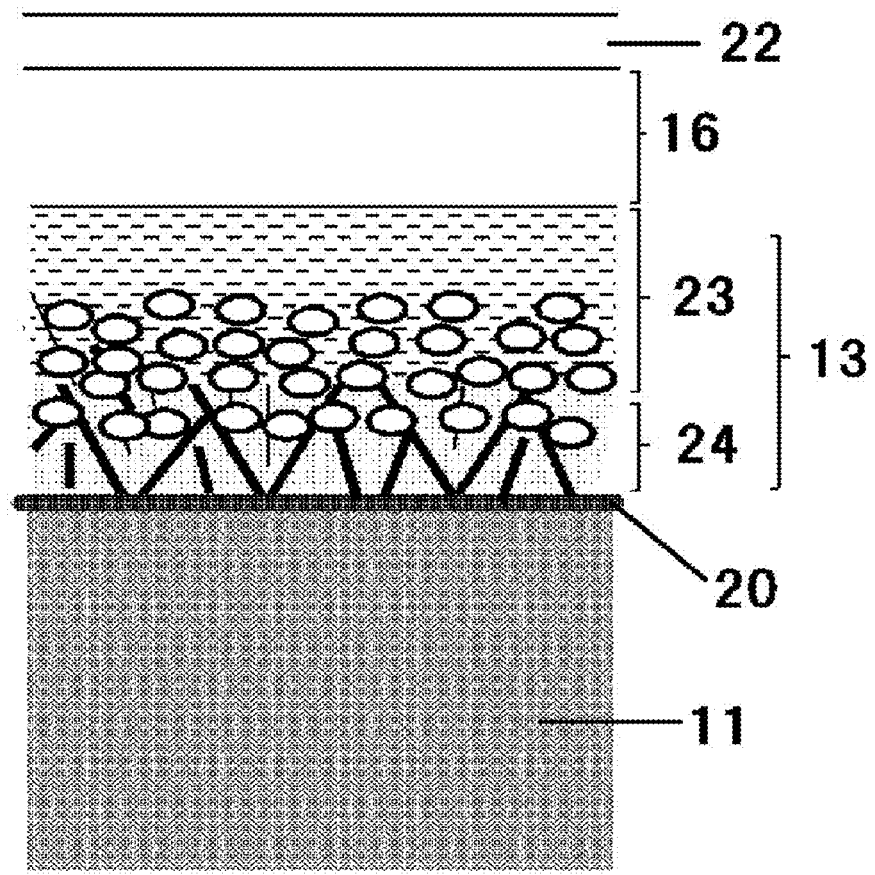

METHOD FOR MANUFACTURING BONDED SOI WAFER AND BONDED SOI WAFER

TECHNICAL FIELD

The present invention relates to a method for manufacturing a bonded SOI wafer, and a bonded SOI wafer.

BACKGROUND ART

As an SOI wafer for a RF (Radio Frequency) device, such an SOI wafer has been manufactured by increasing the resistivity of its base wafer. However, it has been required to cope with higher frequency in order to handle further speedup, and accordingly it comes to be difficult to handle this requirement only by using conventional high-resistance wafers.

Hence, recently, what have been used and actually put into practical use include: a bonded semiconductor wafer having a base wafer composed of a silicon single crystal, a polycrystalline silicon layer on the base wafer, a dielectric layer on the polycrystalline silicon layer, and a single-crystal silicon layer on the dielectric layer; more specifically, what is called a trap-rich type SOI (Silicon on Insulator) substrate having a carrier trap layer. The polycrystalline silicon layer functions as a layer which is effective in annihilating generated carriers (also referred to as carrier trap layer, trap-rich layer).

Regarding the manufacturing of trap-rich type SOI wafers, the following techniques are known.

Patent Documents 1 and 2 state that when a polycrystalline silicon layer is formed on a thin oxide film with a thickness of approximately 1 nm having been formed by cleaning a base wafer, this makes it possible to suppress single-crystallization due to a heat treatment step in an SOI wafer manufacturing process or in a heat treatment in a device manufacturing process, and the effect as a carrier trap layer can be sustained.

Patent Document 3 describes a trap-rich type SOI wafer in which a polycrystalline silicon layer as a carrier trap layer has a thickness of 4 μm or more, and a base wafer has a resistivity of 2 to 4 kΩcm.

Patent Document 4 states that, in forming a trap-rich layer, an upper portion of a polycrystalline layer located at a lower position is amorphized by implanting ions of Ar or the like to avoid epitaxial growth of a polycrystalline layer deposited at an higher position (paragraphs [0043]-[0044], etc.).

Patent Document 5 states that a trap-rich layer contains a polycrystalline structure or an amorphous structure, and that the material of the layer is selected from the group consisting of silicon, SiGe, SiC, and Ge (claim 1 etc.).

Patent Document 6 states that a multiple order radio frequency harmonic suppressing region (trap-rich layer) can contain atoms of implanted ions such as noble gas atoms (such as Ar) (Claims etc.).

CITATION LIST

Patent Literature

Patent Document 1: Japanese Unexamined Patent Publication (Kokai) No. 2015-211074
Patent Document 2: Japanese Unexamined Patent Publication (Kokai) No. 2015-211061
Patent Document 3: Japanese Unexamined Patent Publication (Kokai) No. 2016-143820
Patent Document 4: Japanese Unexamined Patent Publication (Kohyou) No. 2017-510080
Patent Document 5: Japanese Unexamined Patent Publication (Kohyou) No. 2017-538297
Patent Document 6: Japanese Unexamined Patent Publication (Kohyou) No. 2012-517691

SUMMARY OF INVENTION

Technical Problem

As described above, an SOI wafer usable for RF device is required to cope with higher frequency in order to handle further speedup, and it is necessary to further improve harmonic wave characteristics. Furthermore, when DC bias and RF signal are simultaneously applied, second and third harmonic waves (DC bias dependency) need to be suppressed. Nevertheless, there has been no report about suppression of the DC bias dependency.

Meanwhile, in the technique described in Patent Document 2, in the step of depositing a polycrystalline silicon layer, the deposition is performed by two stages of lower-temperature deposition and higher-temperature deposition, so that the productivity is inevitably lowered. In the technique described in Patent Document 3 also, the film formation time is increased because of the formation of a polycrystalline silicon layer with a thickness of 4 μm or more, so that the productivity is lowered. As described above, the conventional techniques have such a problem that improving the harmonic wave characteristics of a carrier trap layer leads to productivity reduction.

Here, the result of examining a relation between bonding failure and the thickness of polycrystalline silicon layers in conventional trap-rich type SOI wafers is shown in Table 1. Table 1 shows data on polycrystalline silicon layers which were formed with a deposition temperature of 1130° C. and a deposition rate of 5 μm/min, followed by surface polishing. Then, the relation between bonding failure and the thickness of the polished polycrystalline silicon layers was examined.

TABLE 1

| | Polycrystalline layer | | |
| --- | --- | --- | --- |
| | Thickness after deposition (μm) | after polishing (μm) | Bonding failure |
| Experimental Example 1 | 1.5 | 0.8 | occurred |
| Experimental Example 2 | 2.0 | 1.3 | occurred |
| Experimental Example 3 | 2.5 | 1.7 | occurred |
| Experimental Example 4 | 2.5 | 1.9 | none |
| Experimental Example 5 | 3.0 | 2.4 | none |
| Experimental Example 6 | 3.5 | 2.7 | none |
| Experimental Example 7 | 5.0 | 4.4 | none |
| Experimental Example 8 | 5.0 | 4.1 | none |

It can be seen from Table 1 that, in the conventional structures, when the polycrystalline silicon layers after polishing were so thin that the thicknesses were in a range of 1.7 μm or less, bonding failures occurred, that is, the thickness of the polished polycrystalline silicon layer should be approximately around 2 μm or more to avoid occurrence of bonding failure. In other words, if the thickness of the polycrystalline silicon layer is simply decreased so as to improve the productivity, this results in the problem of bonding failure. However, if the thickness of the polycrystalline silicon layer is increased, this results in problems of the productivity reduction and wafer warpage.

The present invention has been made to solve the above-described problems. An object of the present invention is to provide: a method for manufacturing a bonded SOI wafer including a trap-rich layer with improved second and third harmonic wave characteristics; and a bonded SOI wafer including a trap-rich layer with improved second and third harmonic wave characteristics.

Another object of the present invention is to: improve the second and third harmonic wave characteristics of a bonded SOI wafer including a trap-rich layer, improve the productivity, and suppress wafer warp and bonding failure.

Solution to Problem

The present invention has been made to achieve the above object, and provides a method for manufacturing a bonded SOI wafer by bonding a bond wafer composed of a silicon single crystal and a base wafer composed of a silicon single crystal with an insulator film interposed therebetween, wherein a silicon single crystal wafer having a resistivity of 100 Ω·cm or more is used as the base wafer, and the method comprises steps of:

forming an underlying insulator film on a bonding surface side of the base wafer;

depositing a polycrystalline silicon layer on a surface of the underlying insulator film;

polishing a surface of the polycrystalline silicon layer;

modifying the polycrystalline silicon layer by performing ion implantation on the polished polycrystalline silicon layer to form a modified silicon layer;

forming the insulator film on a bonding surface of the bond wafer;

bonding the bond wafer and a surface of the modified silicon layer of the base wafer with the insulator film interposed therebetween; and thinning the bonded bond wafer to form an SOI layer.

Such a method for manufacturing a bonded SOI wafer makes it possible to obtain a trap-rich layer with improved second and third harmonic wave characteristics. Particularly, second and third harmonic waves can be suppressed when DC bias and RF signal are simultaneously applied. Moreover, the improvement in the harmonic wave characteristics of the trap-rich layer enables greater thickness reduction than conventional trap-rich layers (polycrystalline layers). As a result, the productivity is increased in relation to the polycrystalline layer deposition, and wafer warpage and bonding failure can be suppressed.

In this event, the modified silicon layer may have a thickness of 100 nm or more and 1000 nm or less.

This allows shortening of the time required for the step of depositing a polycrystalline silicon layer, and further improvement in the productivity. Moreover, wafer warpage and bonding failure can be more effectively suppressed.

In this event, the ions implanted by the ion implantation can be Ar ions.

This enables more effective modification of the polycrystalline structure.

In this event, the underlying insulator film may have a thickness of 0.5 nm or more and 20 nm or less immediately after the deposition of the polycrystalline silicon layer.

This makes it possible to more effectively suppress single-crystallization of the trap-rich layer, which would otherwise occur due to a heat treatment in the SOI manufacturing process.

Additionally, the present invention makes it possible to provide a bonded SOI wafer comprising:

a base wafer composed of a silicon single crystal having a resistivity of 100 Ω·cm or more;

an underlying insulator film on the base wafer;

a modified silicon layer on the underlying insulator film;

an insulator film on the modified silicon layer; and an SOI layer on the insulator film, wherein the modified silicon layer has an amorphous region containing a spherical defect.

Such a bonded SOI wafer achieves improvement in second and third harmonic wave characteristics and is a bonded SOI wafer capable of suppressing second and third harmonic waves when DC bias and RF signal are simultaneously applied. Moreover, the bonded SOI wafer is capable of thinning the modified silicon layer and has little warp and bonding failure.

In this case, the modified silicon layer may have a thickness of 100 nm or more and 1000 nm or less.

Accordingly, warp and bonding failure are further suppressed.

In this case, the underlying insulator film may have a thickness of 0.5 nm or more and 20 nm or less.

Accordingly, single-crystallization of the trap-rich layer is further suppressed.

Advantageous Effects of Invention

As described above, the inventive method for manufacturing a bonded SOI wafer makes it possible to obtain a bonded SOI wafer with improved second and third harmonic wave characteristics. Additionally, the inventive bonded SOI wafer achieves such a bonded SOI wafer that second and third harmonic wave characteristics are improved. Further, since the harmonic wave characteristics of the trap-rich layer are improved, film thickness reduction is possible in comparison with conventional trap-rich layers (polycrystalline layers). Consequently, the productivity is increased in terms of the polycrystalline layer deposition, and wafer warpage and bonding failure can be suppressed.

BRIEF DESCRIPTION OF DRAWINGS

FIG. 1 is a production flow for illustrating an exemplary embodiment of a method for manufacturing an SOI wafer according to the present invention.

FIG. 2 shows schematic sectional views for illustrating an exemplary embodiment of an SOI wafer according to the present invention.

FIG. 3 is a cross-sectional TEM photograph of the inventive SOI wafer.

FIG. 4 is an explanatory drawing of a structure in the cross-sectional TEM photograph of the inventive SOI wafer.

DESCRIPTION OF EMBODIMENTS

Hereinafter, the present invention will be described in detail. However, the present invention is not limited thereto.

As noted above, there have been demands for: a method for manufacturing a bonded SOI wafer including a trap-rich layer with improved second and third harmonic wave characteristics; and a bonded SOI wafer including a trap-rich layer with improved second and third harmonic wave characteristics.

The present inventors have earnestly studied the above-described object and consequently arrived at a method for manufacturing a bonded SOI wafer by bonding a bond wafer composed of a silicon single crystal and a base wafer composed of a silicon single crystal with an insulator film interposed therebetween, the method using a silicon single crystal wafer having a resistivity of 100 Ω·cm or more as the base wafer and including steps of: forming an underlying insulator film on a bonding surface side of the base wafer; depositing a polycrystalline silicon layer on a surface of the underlying insulator film; polishing a surface of the polycrystalline silicon layer; modifying the polycrystalline silicon layer by performing ion implantation on the polished polycrystalline silicon layer to form a modified silicon layer; forming the insulator film on a bonding surface of the bond wafer; bonding the bond wafer and a surface of the modified silicon layer of the base wafer with the insulator film interposed therebetween; and thinning the bonded bond wafer to form an SOI layer. The inventors have found that this method for manufacturing a bonded SOI wafer makes it possible to obtain a trap-rich layer with improved second and third harmonic wave characteristics, and suppress second and third harmonic waves particularly when DC bias and RF signal are simultaneously applied. Moreover, the improvement in the harmonic wave characteristics of the trap-rich layer enables greater thickness reduction than conventional trap-rich layers (polycrystalline layers), consequently increases the productivity in relation to the polycrystalline layer deposition, and allows suppression of warpage and bonding failure. These findings have led to the completion of the present invention.

Furthermore, the present inventors have earnestly studied the above-described object and consequently arrived at a bonded SOI wafer including: a base wafer composed of a silicon single crystal having a resistivity of 100 Ω·cm or more; an underlying insulator film on the base wafer; a modified silicon layer on the underlying insulator film; an insulator film on the modified silicon layer; and an SOI layer on the insulator film. In the bonded SOI wafer, the modified silicon layer has an amorphous region containing a spherical defect. The inventors have found that this bonded SOI wafer achieves improvement in second and third harmonic wave characteristics. These findings have led to the completion of the present invention.

Hereinbelow, an exemplary embodiment of the inventive method for manufacturing a bonded SOI wafer will be described with reference to the drawings. Note that the drawings are conceptual drawings and do not necessarily reflect the actual dimensions.

First, a bond wafer 10 composed of a silicon single crystal is prepared (see Step S11 in FIG. 1, and FIG. 2(a)).

Next, on the bond wafer 10, an insulator film 14, which forms a buried oxide film layer (BOX layer) 16, is grown by, for example, thermal oxidation, CVD, or the like (see Step S12 in FIG. 1, and FIG. 2(b)).

Next, through the top of the insulator film 14, at least one type of gas ions selected from hydrogen ion and rare gas ion are implanted into the bond wafer 10 with an ion implanting apparatus to thereby form an ion implanted layer 17 (see Step S13 in FIG. 1, and FIG. 2(c)). In this event, an accelerating voltage of the ion-implantation is selected such that a targeted thickness of an SOI layer 15 can be obtained.

Next, to remove particles on a bonding surface of the bond wafer 10, pre-bond cleaning is performed (see Step S14 in FIG. 1).

On the other hand, separately from the above-described bond wafer, a base wafer 11 composed of a silicon single crystal is prepared (see Step S21 in FIG. 1, and FIG. 2(d)).

Note that the base wafer 11 having a resistivity of 100 Ω·cm or more can be used for manufacturing radio-frequency devices. The resistivity is more preferably 1000 Ω·cm or more, particularly preferably 3000 Ω·cm or more. The upper limit of the resistivity is not particularly limited, and can be, for example, 50000 Ω·cm.

Next, an underlying oxide film (base oxide film) 20 is formed on the base wafer 11 (see Step S22 in FIG. 1, and FIG. 2(e)). The underlying oxide film 20 preferably has a thickness of 0.5 nm or more and 20 nm or less. When the thickness is within this range, it is possible to more effectively suppress single-crystallization of an amorphous region contained in a modified silicon layer 13, which would otherwise occur due to heat treatment during the SOI manufacturing process.

Examples of the method for forming the oxide film with such a thickness include forming a screen oxide film by thermal oxidation, and forming a thin oxide film (several nm or less) by wet cleaning. An example of the thermal oxidation includes thermal oxidation treatment in a $DryO_2$ atmosphere at 800° C. Examples of the wet cleaning include cleaning with SC1 (a mixed aqueous solution of $NH_4OH$ and $H_2O_2$), SC2 (a mixed aqueous solution of HCl and $H_2O_2$), sulfuric acid-hydrogen peroxide water mixture (a mixed aqueous solution of $H_2SO_4$ and $H_2O_2$), ozone water, etc., and cleaning with a combination thereof. By these methods, a uniform oxide film with a thickness of approximately 0.5 to 20 nm can be formed.

Next, a polycrystalline silicon layer 12 is deposited on the underlying oxide film 20 (see Step S23 in FIG. 1, and FIG. 2(f)). The polycrystalline silicon layer 12 can be deposited at atmospheric pressure with high speed by using a general CVD apparatus and trichlorosilane as a source gas of the polycrystalline silicon layer 12. It is a matter of course that the deposition is also possible in a reduced-pressure atmosphere using monosilane, dichlorosilane, tetrachlorosilane, or the like as the source gas. As long as polycrystalline silicon is grown, the deposition temperature, source gas, deposition pressure, and so forth are not particularly limited.

Next, a surface of the polycrystalline silicon layer 12 deposited on the base wafer 11 is flattened by polishing (see Step S24 in FIG. 1, and FIG. 2(g)). Since the polycrystalline silicon layer 12 has a large surface roughness, it is necessary to flatten the surface by polishing.

Next, as a feature of the present invention, the polished polycrystalline silicon layer 12 is modified by performing ion implantation on the polycrystalline silicon layer 12 to form the modified silicon layer 13 (see Step S25 in FIG. 1, and FIG. 2(h)).

The ions to be implanted are not particularly limited, as long as the ions do not act as a dopant for increasing free carriers and are capable of modifying the polycrystalline structure. The ions to be implanted are preferably Ar ions from the viewpoint of enabling more effective modification. Besides, it is also possible to use Si ions, Ge ions, O ions, C ions, etc.

The ion-implantation accelerating voltage is appropriately set according to the thickness of the polycrystalline silicon layer and the type of the ions to be implanted. The acceleration voltage can be approximately 100 keV to 1 MeV, for example.

The dose is not particularly limited, but can be approximately $0.1\times10^{16}$ to $5\times10^{16}/cm^2$, for example. A higher dose allows the modified silicon layer to expand to a deeper position.

The modified silicon layer preferably has a thickness of 100 nm or more and 1000 nm or less. When the thickness is within this range, the harmonic wave characteristics are further improved, and it is not necessary to excessively form the polycrystalline silicon layer. Thus, higher productivity in the step of depositing a polycrystalline silicon layer is achieved. The thickness is more preferably 200 nm or more and 500 nm or less. Moreover, in view of suppressing occurrence of wafer warpage also, it is better not to form the modified silicon layer that has too large a thickness.

Next, pre-bond cleaning is performed to remove particles on a surface of the modified silicon layer 13 (see Step S26 in FIG. 1).

Note that Steps S11 to S14 in FIG. 1 and Steps S21 to S26 in FIG. 1 can be conducted in parallel.

Next, the base wafer 11 having the modified silicon layer 13 formed and the bond wafer 10 having the insulator film 14 formed are brought into close contact with and bonded to each other such that the surface of the base wafer 11 where the modified silicon layer 13 is formed comes into contact with the implanted surface of the bond wafer 10 (see Step S31 in FIG. 1, and FIG. 2(i)).

Next, the bonded wafer is subjected to a heat treatment to form a micro bubble layer in the ion implanted layer 17 (delamination heat treatment), and is delaminated along the micro bubble layer thus formed. Thus, a bonded SOI wafer 21 is manufactured in which the buried oxide film layer 16 and the SOI layer 15 are formed on the base wafer 11. Note that, in this event, a delaminated wafer 18 having a delaminating plane 19 is derived (see Step S32 in FIG. 1, and FIG. 2(j)).

Next, the bonded wafer 21 is subjected to a bonding heat treatment for increasing the bonding strength at the bonding interface (see Step S33 in FIG. 1).

The bonded SOI wafer 21 can be manufactured in the manner described above.

Example

Hereinafter, the present invention will be described in detail with reference to Example, but the present invention is not limited thereto.

Example

According to the manufacturing method having been described using FIGS. 1 and 2, a bonded SOI wafer was produced. Note that, as the base wafer, a p-type single crystal silicon was used which had a diameter of 200 mm, a crystal orientation of <100>, and a resistivity of 9000 Ω·cm. The base oxide film formation, polycrystalline silicon layer deposition (trichlorosilane was used as the source gas), polishing of the polycrystalline silicon layer, modified silicon layer formation by ion implantation, BOX oxidation, hydrogen ion implantation, delamination heat treatment, and bonding heat treatment were performed under the following conditions.

Underlying oxide film formation: 800° C., dry $O_2$, oxide film thickness: 15 nm Polycrystalline silicon layer deposition: 1130° C., atmospheric pressure, deposition rate: 5 μm/min, film thickness: 1.35 μm Polishing of polycrystalline silicon layer: stock removal: 1 μm (film thickness after polishing: 0.35 μm)

Modified silicon layer formation: $Ar^+$ ion, 210 keV, $1.0\times10^{16}/cm^2$

BOX oxidation: 1050° C., oxide film thickness: 400 nm

Hydrogen ion implantation: 105 keV, $7.5\times10^{16}/cm^2$

Delamination heat treatment: 500° C., 30 minutes, 100% Ar atmosphere

Bonding heat treatment: 900° C. pyrogenic oxidation+ 1100° C. Ar annealing for 120 minutes SOI layer: 145 nm The bonded SOI wafer thus prepared was used to produce a radio-frequency integrated circuit device.

Comparative Example 1

A radio-frequency integrated circuit device was produced using a bonded SOI wafer in the same manner as in Example, except for:

Modified silicon layer formation: none (no Ar ion implantation).

Comparative Example 2

A radio-frequency integrated circuit device was produced using a bonded SOI wafer in the same manner as in Example, except for:

Underlying oxide film formation: cleaning with SC1+ SC2, oxide film thickness: 1 nm Polycrystalline silicon layer deposition: 1000° C., atmospheric pressure, deposition rate: 1.8 μm/min, film thickness: 2.8 μm (1.8 μm after polishing)

Modified silicon layer formation: none (no Ar ion implantation).

Samples obtained from Example and Comparative Examples were evaluated as follows.

After a modified silicon layer was formed, the wafer shape was measured by measuring the surface roughness (RMS) on a 10 μm-square surface of the modified silicon layer with an AFM and measuring the wafer warp (μm).

Moreover, when a base wafer and a bond wafer were bonded, the occurrence of bonding failure was evaluated. When no bonding failure occurred, "bonding failure: none". When bonding failure occurred, "bonding failure: occurred".

The second harmonic wave (2HD) and third harmonic wave (3HD) characteristics of the produced radio-frequency integrated circuit devices were measured. The smaller the numerical value of the second harmonic wave (2HD) and third harmonic wave (3HD) (i.e. larger absolute value of the negative number), the more excellent the device properties.

Moreover, 2HD and 3HD were measured when a DC bias of +20 V or 0 V was applied, and the differences were calculated to evaluate the DC bias dependency of 2HD and 3HD. The smaller calculated value, the more excellent the characteristic and the smaller the bias dependency.

Further, the productivities were compared. The productivities of Example and Comparative Example 1 were calculated and evaluated on the basis that the productivity in the step of depositing a polycrystalline silicon layer in Comparative Example 2 was taken as 1.0.

Table 2 shows a summary of these evaluation results. Note that the conditions of forming the polycrystalline silicon layer 12 and the modified silicon layer 13 are also shown in Table 2.

TABLE 2

| | | Example | Comparative Example 1 | Comparative Example 2 |
|---|---|---|---|---|
| Base wafer | | Diameter: 200 mm, <100>, 9000 Ω cm | | |
| Underlying oxide film | | 15 nm | 15 nm | 1 nm |
| Polycrystalline silicon layer | Deposition temperature | 1130° C. | 1130° C. | 1000° C. |
| | Pressure | atmospheric pressure | atmospheric pressure | atmospheric pressure |
| | Deposition rate | 5 μm/min | 5 μm/min | 1.8 μm/min |
| | Deposition thickness | 1.35 μm | 1.35 μm | 2.8 μm |
| | Thickness after polishing | 0.35 μm | 0.35 μm | 1.8 μm |
| Modified silicon layer formation (ion implantation) | Ion species | Ar$^+$ | n/a | n/a |
| | Acceleration voltage | 210 keV | | |
| | Dose | $1 \times 10^{16}/\text{cm}^2$ | | |
| SOI layer/BOX layer | | | 145 nm/400 nm | |
| 2HD (dBm) | | −106.5 | No measurement due to bonding failure | −106.8 |
| 3HD (dBm) | | −121.0 | | −116.8 |
| 2HD difference (dBm) | | 2.5 | | 34.8 |
| 3HD difference (dBm) | | 13.4 | | 33.3 |
| Surface roughness (RMS) | | 0.268 nm | 0.309 nm | 0.220 nm |
| Warpage | | 13 μm | 7 μm | 43 μm |
| Bonding failure | | none | occurred | none |
| Productivity in step of depositing polycrystalline silicon layer | | 2.5 | 2.5 | 1.0 |

In comparison between Example and Comparative Example 1 where the polished polycrystalline silicon layers had the same thickness, bonding failure occurred in Comparative Example 1, so that it was impossible to measure the harmonic wave characteristics. In contrast, no bonding failure occurred in Example. This indicates that high production yield and excellent harmonic wave characteristics are obtained.

In comparison of the harmonic wave characteristics between Example and Comparative Example 2, since the thickness after polishing in Comparative Example 2 was as large as 1.8 μm to prevent the bonding failure, the characteristic equivalent to that of Example was obtained in regard to 2HD, but the result of 3HD was inferior to that of Example. Meanwhile, the values of the DC bias dependency were larger than those in Example 1. This indicates that excellent DC bias dependency was obtained in Example.

The warpage of Example was successfully reduced to less than half of Comparative Example 2.

Moreover, in Comparative Example 2, the underlying oxide film was 1 nm, and accordingly it was deposited at a lower temperature to prevent single-crystallization of the polycrystalline silicon layer. Hence, the deposition rate was low, and the productivity was lowered. In contrast, in Example where the deposition rate was higher and the deposition thickness was smaller, the productivity is greatly improved.

Further, it was revealed that when the modified silicon layer 13 was formed by implanting ions into the polycrystalline silicon layer 12 as in the present invention, even though this thickness range of the modified silicon layer was 1000 nm (1 μm) or less and the thickness was quite small in comparison with the conventional techniques (see Table 1), no bonding failure occurred. The reason may be conceivably explained in relation to the fact that the surface roughness on the polished surface of the polycrystalline silicon layer 12 was improved by the ion implantation as shown by the surface roughness measurement results of Example and Comparative Example 1. Although the phenomenon of the surface roughness improvement was not clear, conceivable are: (1) the uneven Si crystal surface was knocked on and made smooth by the larger atoms; (2) the high-dose implantation increased the temperature of the silicon surface and caused the rearrangement or other similar modification.

Next, the SOI layer of the bonded SOI wafer obtained in Example was removed, and the resulting cross section was observed with a TEM. FIG. 3 shows the cross-sectional TEM photograph. Moreover, FIG. 4 shows an explanatory drawing of the structure for explaining the cross-sectional TEM photograph in FIG. 3.

By implanting Ar ions into the polycrystalline silicon layer 12 in S25 of FIG. 1 and FIG. 2(h), the polycrystalline silicon layer 12 becomes the modified silicon layer 13. As shown in FIGS. 3 and 4, the modified silicon layer 13 includes an amorphous region 23 containing spherical defects at the top and a polycrystalline layer 24 at the bottom. Note that, in FIGS. 3 and 4, a top coat 22 for TEM observation is formed at the uppermost layer. The spherical defects are presumably formed after the ion-implanted polycrystalline silicon layer 12 underwent heat treatments (delamination heat treatment and bonding heat treatment) in the SOI wafer manufacturing process. The spherical defects have a structure in which spherical cavities (pores) and spherical amorphous silicon are mixed. Additionally, the amorphous structure of the amorphous region is retained by the presence of the underlying oxide film 20. Such a structure as described above was constructed by the present inventors for the first time.

The modified silicon layer 13 having the amorphous region 23 containing these spherical defects makes it possible to obtain a bonded SOI wafer that has little warpage and bonding failure and achieves thickness reduction of the trap-rich layer together with favorable harmonic wave characteristics.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A method for manufacturing a bonded SOI wafer by bonding a bond wafer composed of a silicon single crystal and a base wafer composed of a silicon single crystal with an insulator film interposed therebetween, wherein
a silicon single crystal wafer having a resistivity of 100 Ω·cm or more is used as the base wafer, and
the method comprises steps of:
forming an underlying insulator film on a bonding surface side of the base wafer;
depositing a polycrystalline silicon layer on a surface of the underlying insulator film;
polishing a surface of the polycrystalline silicon layer;
modifying the polycrystalline silicon layer by performing ion implantation on the polished polycrystalline silicon layer to form a modified silicon layer;
forming the insulator film to be a buried oxide film layer of the SOI wafer on a bonding surface of the bond wafer;
bonding the bond wafer and a surface of the modified silicon layer of the base wafer with the insulator film interposed therebetween; and
thinning the bonded bond wafer to form an SOI layer,
wherein the modified silicon layer has a thickness of 100 nm or more and 1000 nm or less.

2. The method for manufacturing a bonded SOI wafer according to claim 1, wherein the ions implanted by the ion implantation are Ar ions.

3. The method for manufacturing a bonded SOI wafer according to claim 1, wherein the underlying insulator film has a thickness of 0.5 nm or more and 20 nm or less immediately after the deposition of the polycrystalline silicon layer.

4. The method for manufacturing a bonded SOI wafer according to claim 2, wherein the underlying insulator film has a thickness of 0.5 nm or more and 20 nm or less immediately after the deposition of the polycrystalline silicon layer.

5. A bonded SOI wafer comprising:
a base wafer composed of a silicon single crystal having a resistivity of 100 Ω·cm or more;
an underlying insulator film on the base wafer;
a modified silicon layer on the underlying insulator film;
an insulator film on the modified silicon layer; and
an SOI layer on the insulator film, wherein
the insulator film on the modified silicon layer is a buried oxide film layer of the SOI wafer, and
the modified silicon layer has an amorphous region containing a spherical defect and has a thickness of 100 nm or more and 1000 nm or less.

6. The bonded SOI wafer according to claim 5, wherein the underlying insulator film has a thickness of 0.5 nm or more and 20 nm or less.

\* \* \* \* \*